(12) United States Patent
Fujii et al.

(10) Patent No.: US 11,195,744 B2
(45) Date of Patent: Dec. 7, 2021

(54) SUBSTRATE TREATMENT APPARATUS AND MANUFACTURING METHOD OF A SEMICONDUCTOR DEVICE

(71) Applicant: TOSHIBA MEMORY CORPORATION, Minato-ku (JP)

(72) Inventors: Motoki Fujii, Yokkaichi (JP); Takuo Ohashi, Kuwana (JP); Daisuke Nishida, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/282,533

(22) Filed: Feb. 22, 2019

(65) Prior Publication Data

US 2020/0075391 A1 Mar. 5, 2020

(30) Foreign Application Priority Data

Aug. 29, 2018 (JP) .............................. JP2018-160629

(51) Int. Cl.
*H01L 21/687* (2006.01)
*H01J 37/32* (2006.01)
*C23C 16/40* (2006.01)
*C23C 16/34* (2006.01)

(52) U.S. Cl.
CPC ...... *H01L 21/68764* (2013.01); *C23C 16/345* (2013.01); *C23C 16/401* (2013.01); *H01J 37/32449* (2013.01); *H01J 37/32834* (2013.01)

(58) Field of Classification Search
CPC .......... H01L 21/68764; H01J 37/32449; H01J 37/32834; C23C 16/345; C23C 16/401
See application file for complete search history.

(56) References Cited

U.S. PATENT DOCUMENTS

| | | | | |
|---|---|---|---|---|
| 6,042,372 A | * | 3/2000 | Sakata | C23C 16/54 432/241 |
| 2008/0283086 A1 | * | 11/2008 | Matsubara | C23C 16/4405 134/1.1 |
| 2009/0289179 A1 | * | 11/2009 | Chen | H05H 3/02 250/251 |
| 2018/0269078 A1 | * | 9/2018 | Cheon | C23C 16/5096 |
| 2019/0198299 A1 | * | 6/2019 | Watanabe | H01J 37/32724 |

FOREIGN PATENT DOCUMENTS

| | | |
|---|---|---|
| JP | 9-289176 | 11/1997 |
| JP | 10-135229 | 5/1998 |
| JP | 2000-235954 | * 8/2000 |
| JP | 2009-170940 | 7/2009 |

\* cited by examiner

*Primary Examiner* — Timor Karimy
(74) *Attorney, Agent, or Firm* — Oblon, McClelland, Maier & Neustadt, L.L.P.

(57) ABSTRACT

A substrate treatment apparatus according to an embodiment of the present invention includes a chamber, a stage, a gas discharger, a plasma generator, and a rotation mechanism. The stage supports a semiconductor substrate in the chamber. The gas discharger discharges a film formation gas toward the semiconductor substrate from a position opposing the stage. The plasma generator is provided on the gas discharger and generates plasma in the chamber during discharge of the film formation gas. The rotation mechanism rotates the stage during generation of the plasma.

4 Claims, 4 Drawing Sheets

SUBSTRATE TREATMENT APPARATUS AND MANUFACTURING METHOD OF A SEMICONDUCTOR DEVICE

CROSS-REFERENCE TO RELATED APPLICATIONS

This application is based upon and claims the benefit of priority from Japanese Patent Application No. 2018-160629, filed on Aug. 29, 2018; the entire contents of which are incorporated herein by reference.

FIELD

An embodiment of the present invention relates to a substrate treatment apparatus and a manufacturing method of a semiconductor device.

BACKGROUND

A manufacturing process of a semiconductor device includes a film formation process for forming a film on a semiconductor substrate. In the film formation process, a film formation method in which radicals are generated is known. Radicals can be generated, for example, by plasma-exciting gas introduced into a chamber.

In the film formation method in which radicals are generated, if plasma is non-uniformly generated in the chamber, the radical density distribution becomes non-uniform. Consequently, the coverage of a film may worsen.

DETAILED DESCRIPTION

Embodiments will now be explained with reference to the accompanying drawings. The present invention is not limited to the embodiments.

A substrate treatment apparatus according to an embodiment includes a chamber, a stage, a gas discharger, a plasma generator, and a rotation mechanism. The stage supports a semiconductor substrate in the chamber. The gas discharger discharges a film formation gas toward the semiconductor substrate from a position opposing the stage. The plasma generator is provided on the gas discharger and generates plasma in the chamber during discharge of the film formation gas. The rotation mechanism rotates the stage during generation of the plasma.

Figure 1:
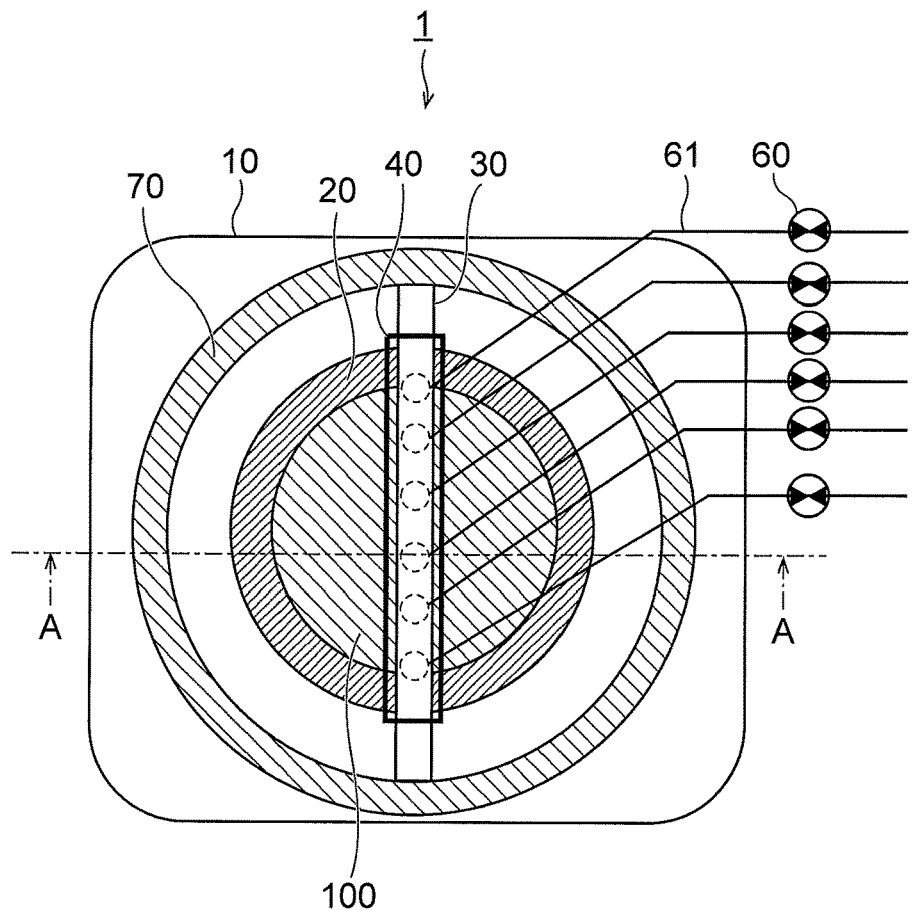
FIG. 1 is a plan view illustrating a schematic configuration of a substrate treatment apparatus according to an embodiment.
Figure 2:
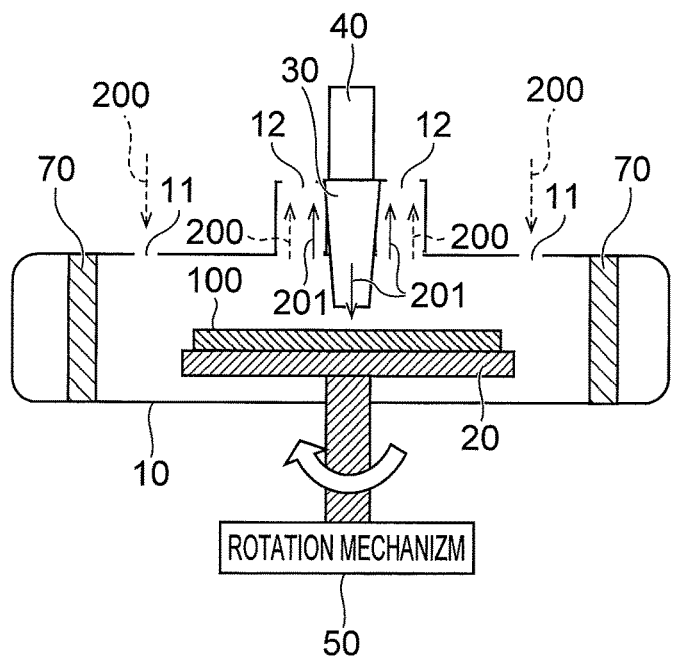
FIG. 2 is a cross-sectional view taken along the line A-A of FIG. 1.

FIG. 1 is a plan view illustrating a schematic configuration of a substrate treatment apparatus according to an embodiment. FIG. 2 is a cross-sectional view taken along the line A-A of FIG. 1. As illustrated in FIGS. 1 and 2, a substrate treatment apparatus 1 according to this embodiment includes a chamber 10, a stage 20, a gas discharger 30, a plasma generator 40, a rotation mechanism 50, a plurality of valves 60, and a heater 70.

The chamber 10 is, for example, a quartz tube. In this embodiment, the stage 20 and the gas discharger 30 are provided in a central portion of the chamber 10. The chamber 10 is provided with an inlet port 11 in its upper end outside the central portion. The inlet port 11 introduces an inert gas 200 into the chamber 10. A nitrogen ($N_2$) gas or an argon (Ar) gas, for example, can be used for the inert gas 200.

The chamber 10 is also provided with an exhaust port 12. The exhaust port 12 is formed between the inlet port 11 and the gas discharger 30. In this embodiment, the exhaust port 12 is formed closer to the gas discharger 30 than to the inlet port 11. The exhaust port 12 exhausts the inert gas 200 and a film formation gas 201 discharged from the gas discharger 30.

The stage 20 supports a wafer-shaped (circular) semiconductor substrate 100 in the chamber 10. The semiconductor substrate 100 is, for example, a silicon substrate.

The gas discharger 30 discharges the film formation gas 201 toward the semiconductor substrate 100 from a position opposing the stage 20. The kind of the film formation gas 201 depends on the kind of a film to be formed on the semiconductor substrate 100. For example, in the case of forming an oxide film, an oxidizing gas, which is a mixture of hydrogen ($H_2$) and oxygen ($O_2$) can be used as the film formation gas 201. In the case of forming a nitride film, a nitriding gas containing ammonia ($NH_3$) can be used as the film formation gas 201.

Figure 3:
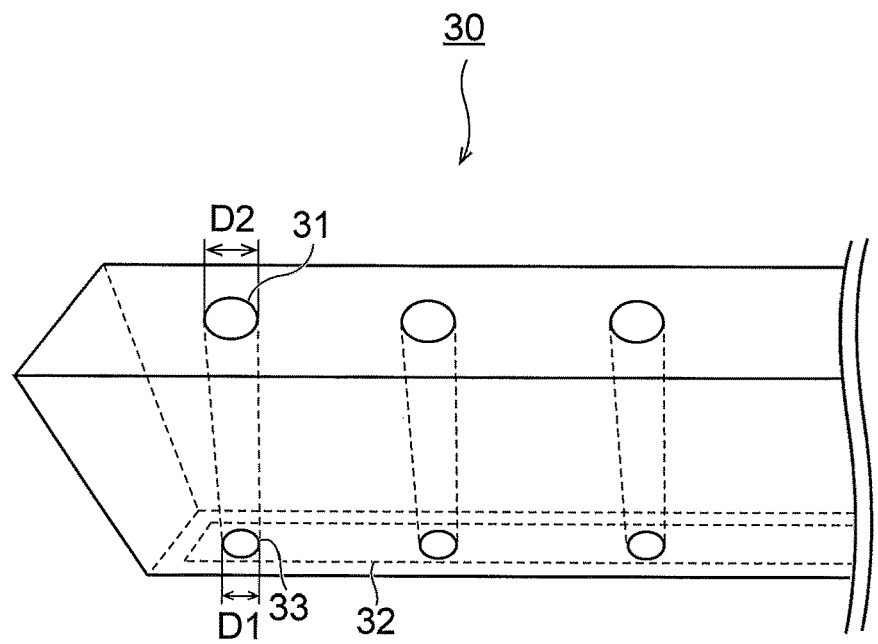
FIG. 3 is a perspective view illustrating a schematic structure of a gas discharger.

FIG. 3 is a perspective view illustrating a schematic structure of the gas discharger 30. As illustrated in FIG. 3, a plurality of supply ports 31 is unidirectionally arranged at equal intervals on an upper surface of the gas discharger 30.

In addition, a slit 32 is formed in a bottom surface of the gas discharger 30. At the slit 32, a plurality of discharge ports 33 are arrayed to be opposed to the plurality of supply ports 31, respectively. The discharge ports 33 discharge the film formation gas 201 supplied to the supply ports 31 toward the semiconductor substrate 100. In this embodiment, the diameter D1 of each discharge port 33 is smaller than the diameter D2 of each supply port 31. In this way, the directivity and flow rate of the film formation gas 201 discharged from the discharge ports 33 can be increased.

In this embodiment, the supply ports 31 and the discharge ports 33 are arrayed along the centerline of the semiconductor substrate 100. Further, lengths of the supply port array and the discharge port array are substantially the same as the diameter of the semiconductor substrate 100.

As illustrated in FIG. 2, the plasma generator 40 is provided on the gas discharger 30. In the plasma generator 40, a coil (not shown) is connected to a radio frequency power supply (not shown). When a radio frequency power is applied to the coil from the radio frequency power supply, plasma is generated in the chamber 10.

The rotation mechanism 50 is coupled to the stage 20. The rotation mechanism 50 includes a motor rotating the stage 20 and a drive circuit of the motor.

The valves 60 are provided to a plurality of supply paths 61, respectively. The supply paths 61 individually communicate with the respective supply ports 31. By controlling the valves 60 to be opened or closed, the film formation gas 201 can be individually supplied to each supply port 31.

The heater 70 surrounds an internal space of the chamber 10. In this embodiment, the chamber 10 is a double-tank quartz tube that includes an inner tank and an outer tank. The inner tank accommodates the stage 20 and the gas discharger 30. The heater 70 is provided between the inner tank and the outer tank. Temperature of the heater 70 is adjusted, thereby controlling temperature in the chamber 10, i.e., the temperature condition when a film is formed on the semiconductor substrate 100.

Figure 5:
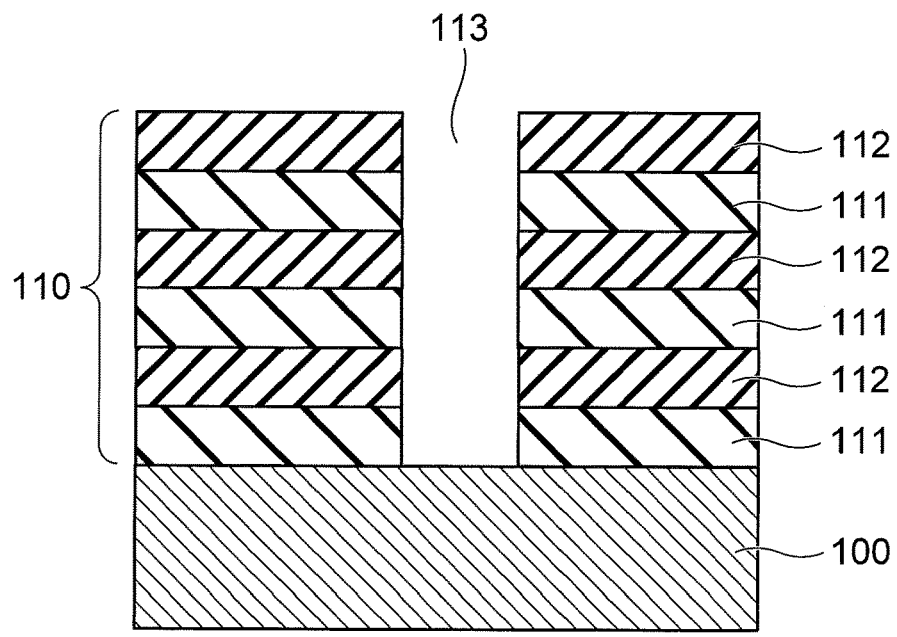
FIG. 5 is a cross-sectional view illustrating a state of a semiconductor device before film formation.
Figure 6:
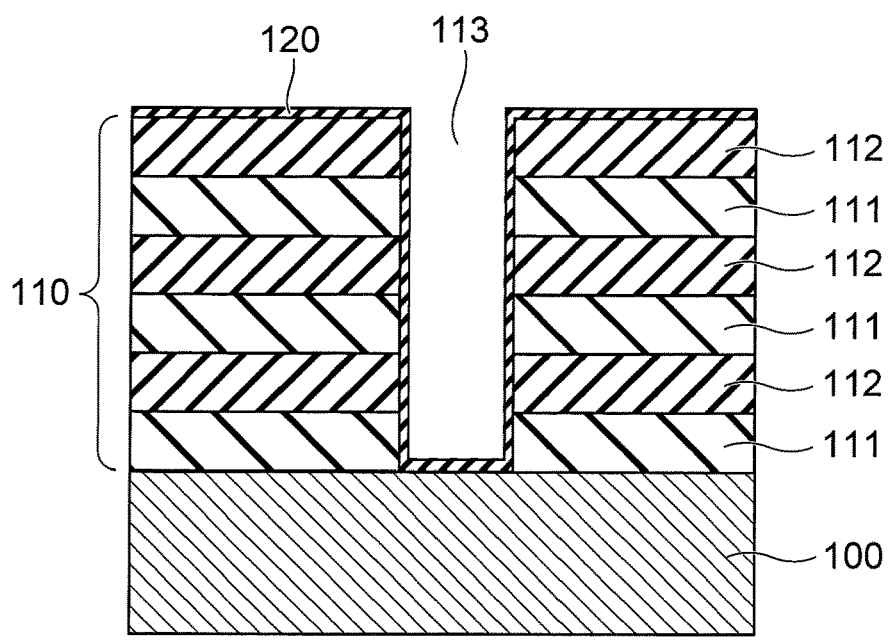
FIG. 6 is a cross-sectional view illustrating a state of the semiconductor device after film formation.

A manufacturing method of a semiconductor device using the substrate treatment apparatus 1 according to this embodiment will be described below with reference to FIGS. 4 to 6. A film formation process of a three-dimensional semiconductor storage in which electrode layers are laminated will be described herein as an example of the semiconductor device.

Figure 4:
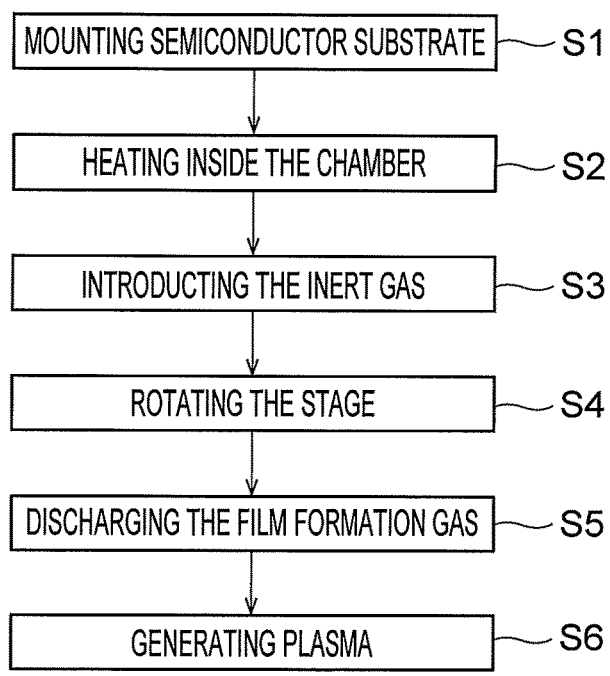
FIG. 4 is a flow chart of film formation processing by the substrate treatment apparatus according to an embodiment.

FIG. 4 is a flow chart of film formation processing by the substrate treatment apparatus 1 according to this embodiment. FIG. 5 is a cross-sectional view illustrating a state of the semiconductor device before film formation. FIG. 6 is a cross-sectional view illustrating a state of the semiconductor device after film formation.

First, the semiconductor substrate 100 is mounted on the stage 20 (STEP S1). At that time, as illustrated in FIG. 5, a laminate 110 is formed on the semiconductor substrate 100. The laminate 110 includes films 111 and films 112 which are alternately laminated. The films 111 are, for example, silicon oxide films ($SiO_2$). On the other hand, the films 112 are, for example, silicon nitride films (SiN).

The films 112 can be replaced with, for example, electrode layers containing tungsten. Further, the laminate 110 is formed with a hole 113.

Next, the heater 70 heats inside the chamber 10 to a film formation temperature (STEP S2). The film formation temperature can be set to, for example, a temperature higher than 200° C. and is set to 900° C. in this embodiment.

When the internal temperature of the chamber 10 reaches the film formation temperature, the inert gas 200 is introduced into the chamber 10 from the inlet port 11 (STEP S3). The inert gas 200 thus introduced is exhausted from the exhaust port 12. In this way, particles are removed from the chamber 10. Introducing the inert gas 200 into the chamber 10 continues in the subsequent STEPs of STEP S3, as well.

Then, the rotation mechanism 50 rotates the stage 20 (STEP S4). At that time, the semiconductor substrate 100 mounted on the stage 20 is also rotated. During rotation of the stage 20, the gas discharger 30 discharges the film formation gas 201 into the chamber 10 (STEP S5). In STEP S5, an oxidizing gas, which is mixture of hydrogen and oxygen, is discharged as the film formation gas 201 from the gas discharger 30. The gas discharger 30 continues to discharge the film formation gas 201 into the chamber 10 in the subsequent STEPs of STEP 5.

After that, the plasma generator 40 generates plasma in the chamber 10 (STEP S6). The film formation gas 201 is excited by this plasma and OH radicals and O radicals are generated. Consequently, as illustrated in FIG. 6, a film 120 is formed on a surface of the laminate 110 including an inner surface of the hole 113. In this embodiment, the film 120 is an oxidizing film that functions as a part of a memory film holding electrons. Note that the film 120 is not limited to the oxidizing film and may be a nitriding film.

The rotation mechanism 50 continues rotating the stage 20 while the plasma generator 40 is generating plasma, as well.

Figure 7:
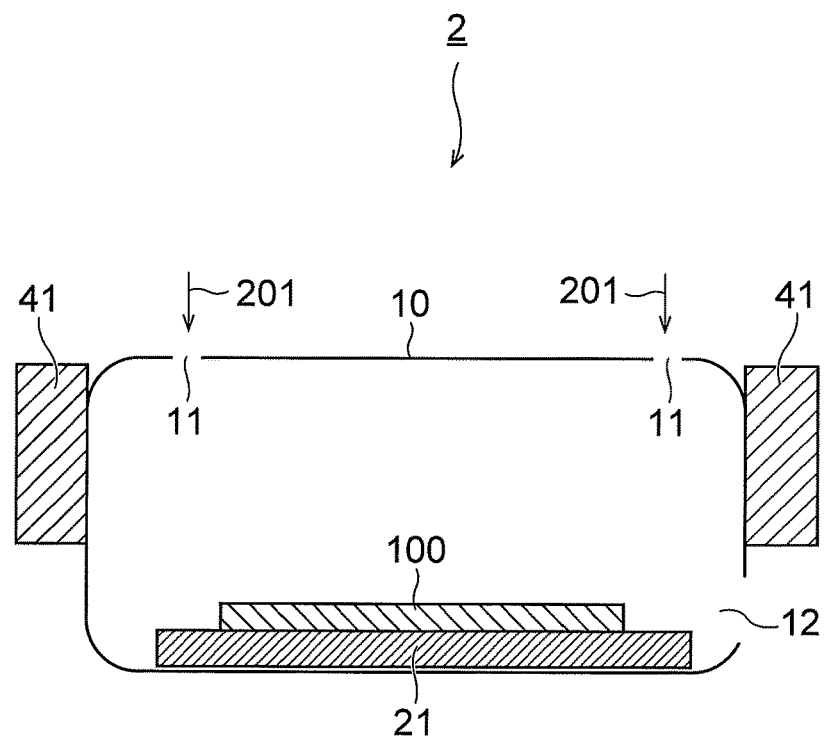
FIG. 7 is a cross-sectional view illustrating a schematic configuration of a substrate treatment apparatus according to a comparative example.

FIG. 7 is a cross-sectional view illustrating a schematic configuration of a substrate treatment apparatus according to a comparative example. In a substrate treatment apparatus 2 illustrated in FIG. 7, the semiconductor substrate 100 is supported by a stage 21. The stage 21 has a heater function of heating the semiconductor substrate 100 and is fixed within the chamber 10.

In the substrate treatment apparatus 2, the film formation gas 201 is introduced into the chamber 10 from the inlet port 11. In addition, plasma is generated in the chamber 10 by a coil 41. The film formation gas 201 is excited by the plasma, thereby generating radicals. The radicals thus generated are exhausted from the exhaust port 12 provided in a lower side of the chamber 10.

In the substrate treatment apparatus 2, the coil 41 is provided on an outer circumferential surface of the chamber 10. For this reason, since an amount of plasma to be generated decreases as a distance from the coil 41 increases, an amount of radicals to be generated becomes non-uniform. As the result, the film thickness of the semiconductor substrate 100 gets thinner from its end to its center part; therefore, the possibility of worsening the coverage becomes high.

On the other hand, in this embodiment, the plasma generator 40 is provided above the semiconductor substrate 100. Plasma is therefore uniformly generated on the semiconductor substrate 100. In addition, since the gas discharger 30 opposes the semiconductor substrate 100, the film formation gas 201 discharged from the gas discharger 30 is uniformly excited. Furthermore, the rotation mechanism 50 rotates the stage 20, thereby uniformly supplying radicals generated by excitement of the film formation gas 201 to the entire surface of the semiconductor substrate 100. According to this embodiment, the thickness of the film 120 is therefore made uniform, and the coverage can be improved.

Further, in the gas discharger 30 of this embodiment, the diameter D1 of each discharge port 33 is smaller than the diameter D2 of each supply port 31. That is, the discharge ports 33 are tapered. For this reason, the flow rate and directivity of the film formation gas 201 become high. This enables the film formation gas 201 to sufficiently reach the semiconductor substrate 100.

Figure 8:
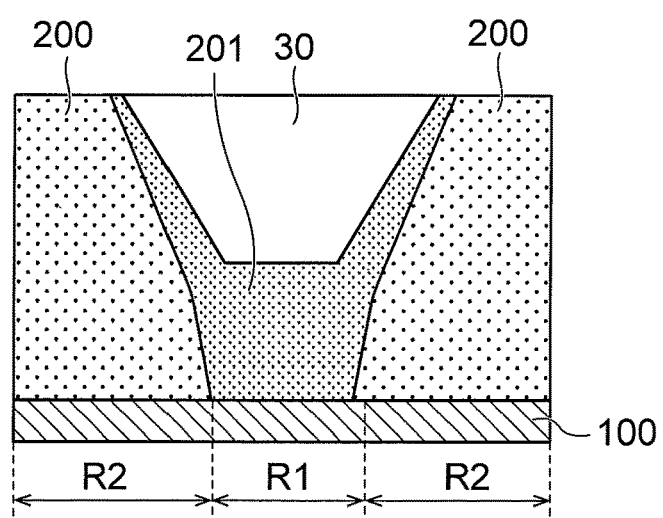
FIG. 8 is a cross-sectional view illustrating a state where a film is partially formed on a semiconductor substrate.

Furthermore, in this embodiment, by controlling the valves 60 to be opened or closed, the flow rate and discharge region of the film formation gas 201 discharged from the discharge ports 33 can be adjusted. Accordingly, as illustrated in FIG. 8, a central region R1 of the semiconductor substrate 100 can be set as a region where the film 120 is formed, and an outer region R2 of the central region R1 can be set as a region where the film 120 is not formed. That is, an oxidizing (a nitriding) region and a non-oxidizing (a non-nitriding) region can be formed in the semiconductor substrate 100. In this way, a film can be partially formed on the semiconductor substrate 100.

Moreover, in this embodiment, the inert gas 200 flows from the inlet port 11 to the exhaust port 12 during discharge of the film formation gas 201. The exhaust port 12 is provided in the vicinity of the gas discharger 30. Owing to this, the film formation gas 201 can be suppressed from dispersing outside the region right under the gas discharger 30 by the flow of the inert gas 200. That is, the film formation gas 201 can be restricted within the film formation region of the semiconductor substrate 100. Consequently, the film formation gas 201 can be efficiently used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a chamber;
a stage to support a semiconductor substrate in the chamber;
a gas discharger to discharge a film formation gas toward the semiconductor substrate from a position opposing the stage;
a plasma generator provided on the gas discharger and to generate plasma in the chamber during discharge of the film formation gas; and
a rotation mechanism to rotate the stage during generation of the plasma, wherein
the stage and the gas discharger are arranged in a central portion of the chamber, and
an inlet port to introduce an inert gas into the chamber is provided outside the central portion, and
an exhaust port to exhaust the film formation gas and the inert gas from the chamber is provided between the gas discharger and the inlet port, and
the gas discharger includes a plurality of supply ports to which the film formation gas is supplied, and a plurality of discharge ports to discharge the film formation gas supplied through the supply ports, and
a diameter of the each discharge port is smaller than that of the each supply port, the each discharge port and the each supply port being connected via an opening that is tapered such that the film formation gas gains an increased flow rate directed toward the semiconductor substrate in the chamber, and
the gas discharger extends linearly at the central portion of the chamber, and
the supply ports are unidirectionally arranged at equal intervals on an upper surface of the gas discharger, and
a slit is formed in a bottom surface of the gas discharger, and
the discharge ports are arrayed to be opposed to the supply ports, respectively, at the slit, and
the exhaust port is provided on a side surface of the gas discharger.

2. The substrate treatment apparatus according to claim 1, further comprising a plurality of valves provided to respective supply paths, the supply paths individually supplying the film formation gas to their respective supply ports.

3. The substrate treatment apparatus according to claim 1, further comprising a heater that surrounds the chamber.

4. The substrate treatment apparatus according to claim 1, wherein the film formation gas is an oxidizing gas or a nitriding gas.

* * * * *